United States Patent [19]

Bauer

[11] Patent Number: 4,600,970
[45] Date of Patent: Jul. 15, 1986

[54] LEADLESS CHIP CARRIERS HAVING SELF-ALIGNING MOUNTING PADS

[75] Inventor: John A. Bauer, Medford, N.J.
[73] Assignee: RCA Corporation, Princeton, N.J.
[21] Appl. No.: 614,661
[22] Filed: May 29, 1984
[51] Int. Cl.[4] ............................................. H05K 1/11
[52] U.S. Cl. ................................ 361/403; 114/52 FP
[58] Field of Search ............... 29/464, 577 R, 602 R; 156/151, 154, 290, 291, 293; 174/52 FP, 68.5; 204/14.1, 15, 16; 338/22 R, 22 SD; 339/60 R, 64 R, 95 R; 357/65, 66, 68, 74, 75, 80; 361/380, 386, 403, 404, 405, 406, 411, 388, 418; 427/82, 96

[56] References Cited

U.S. PATENT DOCUMENTS

| | | | |
|---|---|---|---|
| 3,344,316 | 9/1967 | Stelmak | 361/405 |
| 3,869,787 | 3/1975 | Umbaugh | 29/464 X |
| 4,056,681 | 11/1977 | Cook, Jr. | 174/52 FP |
| 4,417,296 | 11/1983 | Schelhorn | 361/386 |
| 4,458,297 | 7/1984 | Stopper et al. | 361/403 |
| 4,475,007 | 10/1984 | Ohno | 174/52 FP |
| 4,489,365 | 12/1984 | Daberkoe | 174/68.5 X |
| 4,509,096 | 4/1985 | Baldwin et al. | 361/403 X |

OTHER PUBLICATIONS

"Guidelines for Surface Mounting and Interconnecting Chip Carriers", by: IPC, The Institute for Interconnecting and Packaging Electronic Circuits, Evanston, Ill., Nov. 1983, p. 24.

Primary Examiner—Arthur T. Grimley
Assistant Examiner—D. A. Tone
Attorney, Agent, or Firm—Joseph S. Tripoli; Robert L. Troike; Robert Ochis

[57] ABSTRACT

A pad configuration for surface mounted components having contact pads along the periphery thereof includes a plurality of interior pads distributed in a grid with the period of interior pads being three quarters of the period of the peripheral pads multiplied by an integer greater than 1.

8 Claims, 10 Drawing Figures $T_h = \frac{3}{2} t_h$
$T_v = \frac{3}{2} t_v$

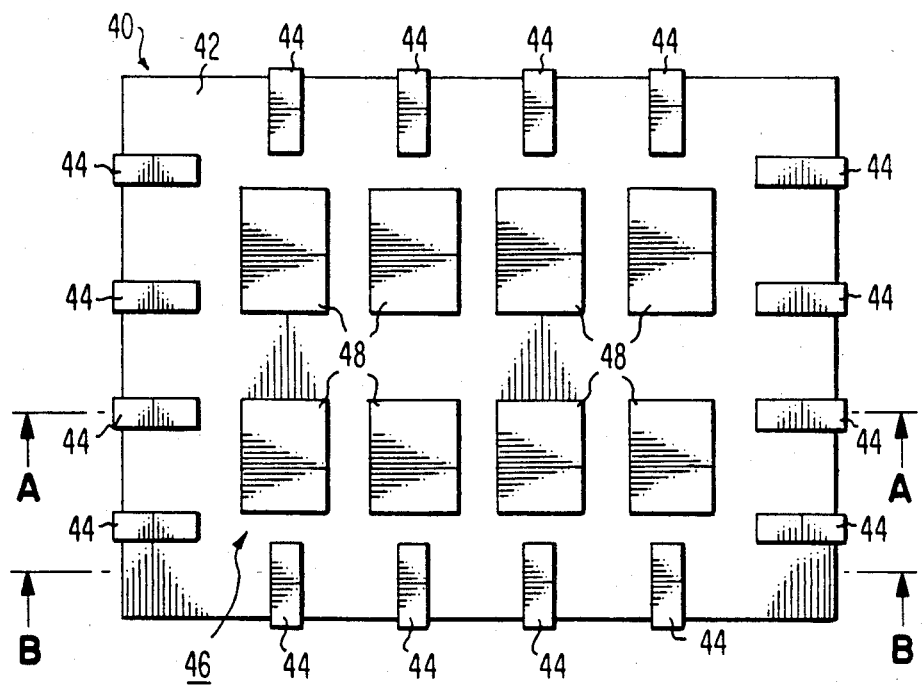
Fig. 1
PRIOR ART
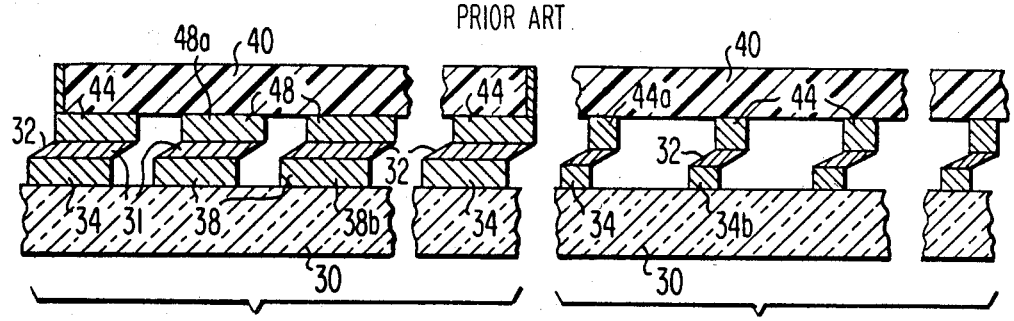
Fig. 2A
PRIOR ART
Fig. 2B
PRIOR ART
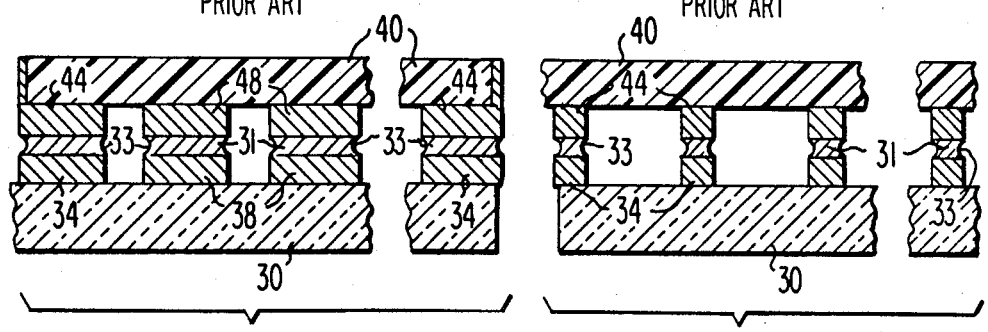
Fig. 3A
PRIOR ART
Fig. 3B
PRIOR ART $T_h = {}^3/_2\, t_h$
$T_v = {}^3/_2\, t_v$ $T_h = 3t_h$
$T_v = {}^3/_2\, t_v$

LEADLESS CHIP CARRIERS HAVING SELF-ALIGNING MOUNTING PADS

BACKGROUND OF THE INVENTION

The present invention relates to the field of surface mounted ("leadless") electronic components and more particularly to the mounting pad configurations of leadless components and the surfaces to which they are to be mounted.

A conventional surface mounted chip carrier, also known as a leadless chip carrier (LCC) has a plurality of electrical contact pads distributed along the periphery of its mounting surface. Usually, the space between the pads is equal to the pad width. A surface mounted component is mounted on a printed circuit substrate by solder bonding of the electrical contact pads of the LCC to an aligned, matching, set of electrical contact pads on the printed circuit substrate. This printed circuit substrate may be a ceramic substrate such as alumina, a fiber glass printed circuit board, or a porcelain coated metal printed circuit board.

Solder attachment of surface mounted components is normally done by coating the contact pads of the component and the printed circuit substrate with solder, placing the chip carrier on the substrate in its intended position and heating the carrier and substrate to melt the solder. This heating step is referred to as reflowing the solder. The composite structure is then allowed to cool to solidify the solder. While the solder is in a molten state, its surface tension provides a force which tends to shift a slightly out-of-alignment chip carrier so that its contact pads are in perfect alignment with the contact pads on the printed circuit substrate.

Printed substrates with surface mounted components mounted on both major surfaces of the substrate are now in use. These substrates are produced by mounting components on a first major surface of the printed circuit substrate in the just-described manner. Once the solder has solidified the substrate is inverted. The components to be mounted on the second major surface are placed on the substrate in proper alignment with contact pads on that surface of the substrate. The substrate and the components on both substrate surfaces are then heated to reflow the solder which will bond components to the second (now upper) surface. During this reflow step the solder bonding the components to the first side of the board also reflows. The surface mounted chip carriers on the first, now lower, side of the substrate are retained on the substrate by the surface tension of the solder between the contact pads of the carrier and the substrate. This is because the combined surface tension of the solder on all of the contact pads of a carrier exceeds the force of gravity on the package.

As circuits have become more complicated, thereby requiring more electrical leads, the chip carrier art has moved in the direction of providing larger packages having narrower electrical contact pads in order to fit more leads on a package.

Several potential problems are presented by the use of larger chip carriers. First, as the size of chip carriers increases, their mass also increases. In consequence, there is a concern for the ability of the electrical contact pads to provide sufficient solder surface tension to hold components on the lower side of the substrate during solder reflow of components on the upper side of the printed circuit substrate. Second, achieving proper alignment between the carrier contact pads and the substrate contact pads becomes more difficult because of the larger size of the carrier and the smaller size of the contact pads.

SUMMARY OF THE INVENTION

The present invention increases the self-alignment force on a surface mounted chip carrier during solder reflow. This carrier has a plurality of peripheral pads disposed along the ends of its mounting surface. Interior pads are provided on an inner portion of the mounting surface. These interior pads are positioned along a given end with a period which is three quarters of the peripheral pad spatial period multiplied by an integer greater than one.

BRIEF DESCRIPTION OF THE DRAWINGS

FIG. 1 is a plan view of the mounting surface of a prior art surface mounted chip carrier having contact and bonding pads;

FIG. 2A illustrates misalignment of the bonding pads of the carrier of FIG. 1 with those of a substrate;

FIG. 2B illustrates corresponding misalignment of the contact pads of the carrier of FIG. 1 with those of the substrate;

FIGS. 3A and 3B illustrate proper alignment of the bonding and contact pads in FIGS. 2A and 2B, respectively;

FIG. 1 is a plan view of the mounting surface 42 of a prior art surface mounted leadless chip carrier (LCC) 40. A plurality of electrical contact pads 44 are distributed along the periphery of surface 42. A thermal bonding pad 46 is disposed in the interior of mounting surface 42. Bonding pad 46 is in the form of eight spaced-apart sub-pads 48. FIG. 1 is from FIG. 4 of U.S. Pat. No. 4,417,296 entitled, "METHOD OF CONNECTING SURFACE MOUNTED PACKAGES TO A CIRCUIT BOARD AND THE RESULTING CONNECTOR" by Robert L. Schelhorn which is assigned to the present assignee and is incorporated herein by reference. The Schelhorn patent is concerned with increasing the resistance to thermal fatigue of the solder bonds between the electrical contact pads 44 of the chip carrier 40 and contact pads or lands on a printed circuit substrate. The thermal bonding pad 46 is designed to provide a large bonding area for the chip carrier. This large bonding area reduces the strain which temperature cycling induces in the solder which bonds the pads 44 to corresponding pads on a printed circuit substrate. This is further explained in the Schelhorn patent. Although the thermal bonding pads 48 are intended to increase the durability of solder bonds, they also have the effect of increasing the overall surface tension holding an underside component on a printed circuit substrate during reflow of upper side components. When in a molten state, the solder on these pads can also provide a self-alignment force. However, as is explained later, the configuration of these pads is not ideal for maximizing the self-alignment capabilities of the chip carrier pad configuration.

Figure 4:
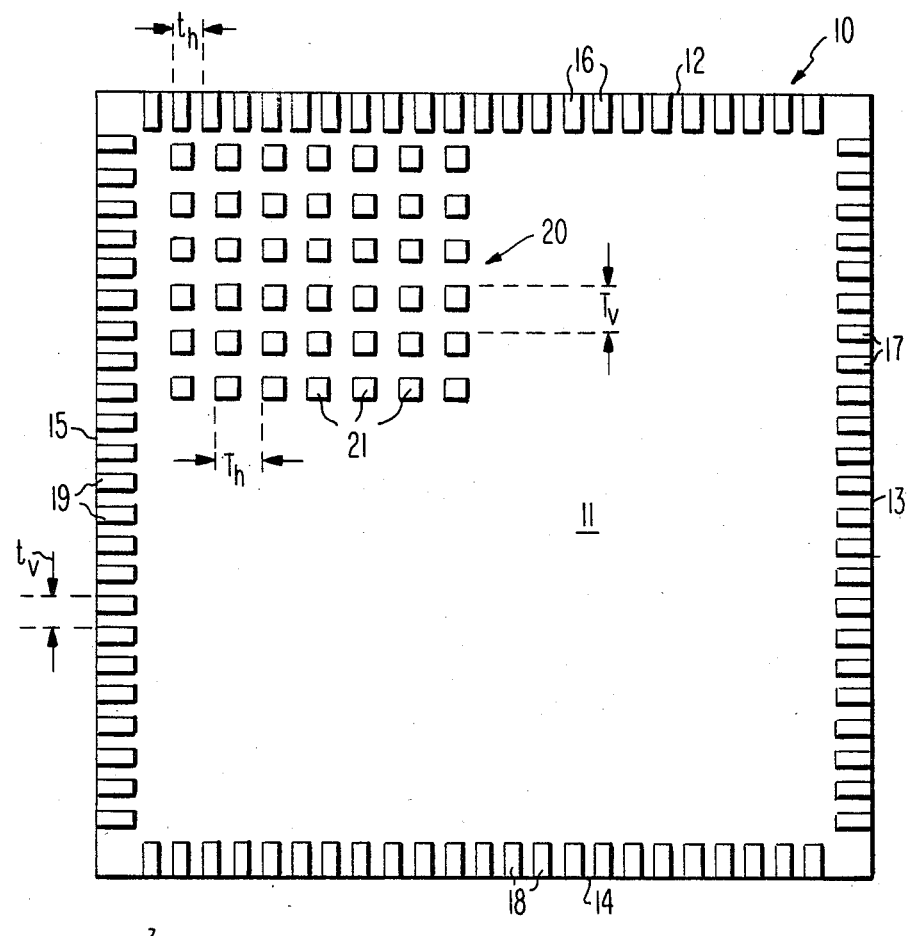
FIG. 4 is a plan view of a preferred embodiment of the invention.

Even with high quality chip carrier placement equipment, some chip carriers will be placed slightly out of alignment with the contact pads on the printed circuit substrate to which they are to be bonded. A chip carrier 40 assembled to a substrate 30 is illustrated in cross-section in FIGS. 2A, 2B, 3A and 3B. The FIG. 2A and FIG. 3A views are taken along the line A—A in FIG. 1. The FIG. 2B and FIG. 3B views are taken along the line B—B in FIG. 1.

An example of misalignment between the chip carrier 40 and the substrate 30 is illustrated in the FIG. 2A and 2B cross-sections where the bonding pads 48 and the contact pads 44 of the chip carrier 40 are shown displaced to the right with respect to the corresponding bonding pads 38 and contact pads 34 on a printed circuit substrate 30. The molten solder 31 which extends between a pad on chip carrier 40 and a pad on substrate 30 has a long meniscus 32 which stretches between the ought-to-be aligned edges of the pads. The surface tension of the long meniscus 32 tends to pull each pad 44 or 48 into proper alignment with its respective associated pad 34 or 38.

FIGS. 3A and 3B are similar to FIGS. 2A and 2B, but have pads 48 and 44 properly aligned with pads 38 and 34. From FIGS. 3A and 3B it is seen that the meniscus 33 under these conditions is much shorter than the meniscus 32 in FIGS. 2A and 2B. The surface tension of the solder 31 along the long meniscus 32 provides a force for pulling the pads in FIGS. 2A and 2B into alignment because the longer meniscus condition of the solder in FIGS. 2A and 2B is a relatively high energy state for the molten solder and the shorter meniscus condition of the solder in FIGS. 3A and 3B is a relatively low energy state for the molten solder. In FIGS. 2A and 2B the solder surface tension between thermal bonding pads 44 and 34 provides an alignment force which urges the chip carrier toward a position in which its contact pattern will be aligned with the substrate contact pattern. However, the configuration of these thermal bonding pads limit the amount of displacement for which the solder's surface tension can apply an alignment correcting force because a slightly greater misalignment of the thermal bonding pads in FIG. 2A would result in the solder on a pad 48a contacting the solder on a pad 38b with which it should *not* be aligned. This would tend to hold the chip carrier 40 in a misaligned position because of the relatively high force (or energy) required to break the meniscus connecting pad 48a to pad 38b and because the self-alignment force tends to pull pad 48a into alignment with pad 38b. Referring to FIG. 2B, it will be noted that substantially greater misalignment between the pads 44 and 34 would be possible without the solder on contact pad 44a contacting the solder on contact pad 34b.

DETAILED DESCRIPTION OF THE PREFERRED EMBODIMENT

The present invention is an improved configuration for interior (bonding) pads on the mounting surface of an LCC in which these interior pads provide a self-alignment force which supplements that provided by the peripheral pads which provide electrical connections. This configuration maximizes the opportunity for the solder tension forces to correct for misalignment between the pads on the chip carrier and the pads on the printed circuit substrate.

The mounting surface of a leadless chip carrier 10 having a pad configuration in accordance with the present invention is illustrated in plan view in FIG. 4. Mounting surface 11 is rectangular and has four linear ends, 12, 13, 14 and 15. A plurality of spaced electrical contact pads 16 are disposed on surface 11 in a first row along the first (upper horizontal in FIG. 4) end 12 and a similar plurality of spaced contact pads 18 are disposed on surface 11 in a second row along the third (lower horizontal in FIG. 4) end 14. A similar plurality of spaced contact pads 17 is disposed in a column along the second (righthand vertical in FIG. 4) end 13. A similar plurality of spaced contact pads 19 are disposed in a second column along the fourth (lefthand vertical in FIG. 4) end 15. The peripheral pads 16 and 18 are disposed along the respective ends 12 and 14 in a grid having a horizontal period $t_h$. In a similar manner the peripheral pads 17 and 19 are disposed along the respective ends 13 and 15 in a grid having a vertical period $t_v$ along those ends. Each of the pads 16 and 18 has a horizontal width which is one half of their horizontal $t_h$. Similarly, each of the pads 17 and 19 has a vertical height which is one half of their vertical period $t_v$. All of the peripheral pads 16–19 are rectangular. The pads 16 and 18 are directly aligned across the body of the chip carrier as are the pads 17 and 19. This is conventional, as is having the horizontal period $t_h$ equal to the vertical period $t_v$.

In addition to the peripheral pads 16–19 which conventionally provide all of the desired electrical connections, chip carrier 10 has a set 20 of interior (bonding) pads 21 disposed in the inner portion of the mounting surface 11. The set 20 is shown only in the upper left portion of surface 11, but actually extends across the entire interior portion of surface 11. The interior pads 21 are disposed in rows and columns in a rectangular (square in this embodiment) grid. This grid has a horizontal period $T_h$ along the rows parallel to the horizontal ends 12 and 14 and a vertical period $T_v$ along the columns parallel to the vertical sides 13 and 15. In accordance with this invention:

$$T_h = (\tfrac{3}{4}) I_h t_h,$$

where $I_h$ is an integer greater than 1, and $$T_v = (\tfrac{3}{4}) I_v t_v,$$

where $I_v$ is an integer greater than 1.

In this embodiment, $I_h = I_v = 2$ and the interior pad horizontal period $T_h$ is one and one half times the peripheral pad horizontal period $t_h$ and the interior pad vertical period $T_v$ is one and one half times the peripheral pad vertical period $t_v$. The interior pads 21 have a horizontal width which is equal to $\tfrac{3}{4}$ of the peripheral horizontal period $t_h$ and have a vertical height which is equal to $\tfrac{3}{4}$ of the peripheral vertical period $t_v$. Thus, each of the interior pads 21 has a horizontal width of $(\tfrac{3}{4}) t_h$ and a vertical height of $(\tfrac{3}{4}) t_v$. A similar relationship exists between the spaces between the interior bonding pads and the periods of the peripheral electrical contact pads. This sizing and spacing of the interior pads ensures that the interior pads 21 will provide an alignment force which is exerted in the proper direction to pull the chip into proper alignment with the substrate so long as any misalignment between the pads of the chip and the pads of the substrate does not result in solder contact between misassociated pads. However, if the peripheral pads are so misaligned that they are completely out of alignment with their associated pad and therefore overlap a different pad, that misalignment is not normally correctable by the alignment force exerted by the solder on the interior pads. This is because of the large force necessary to break the meniscuses between the misassociated pads. However, with some misalignments which involve rotation of the chip carrier pad configuration relative to the substrate pad configuration, it is possible for only a few of the peripheral pads to be misaligned to the point where their solder forms a meniscus to a wrong pad. So long as most of the peripheral pads have meniscuses to their associated pad, the interior pads may provide a sufficient alignment force to break the few misaligned meniscuses and pull the chip carrier into proper alignment with the substrate contact pattern.

Figure 5:
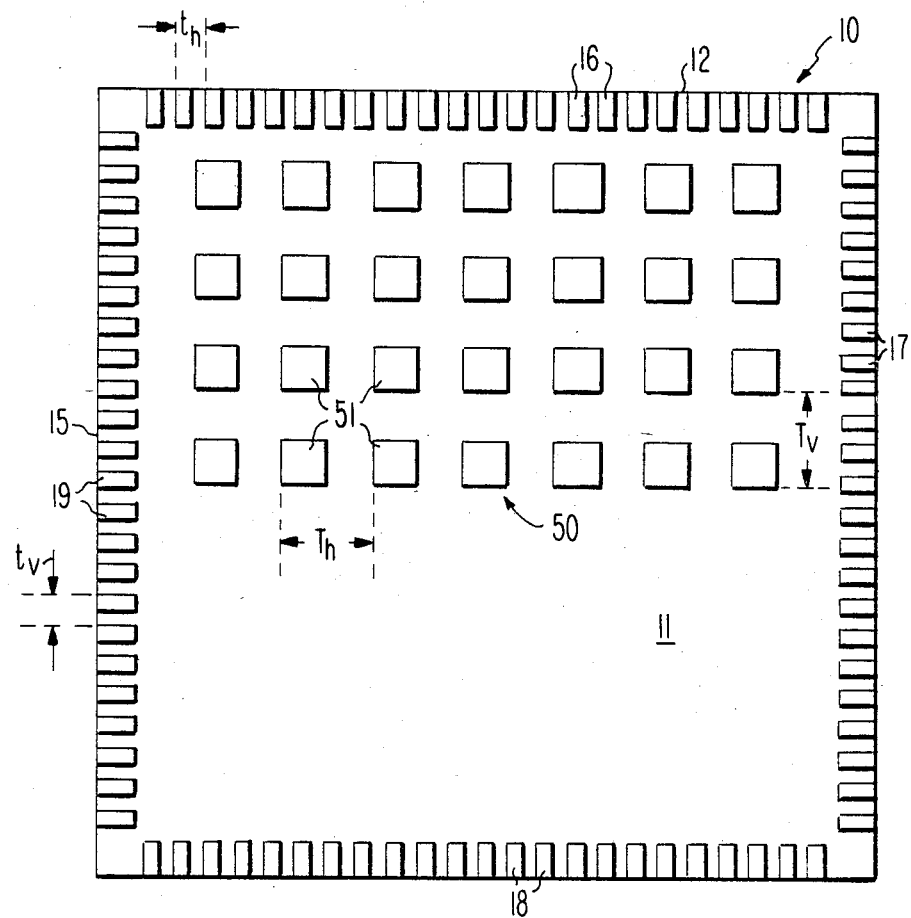
FIGS. 5–8 illustrate alternative configurations for bonding pads in accordance with the present invention.

In FIG. 5 an alternative set of 50 of bonding pads 51 is illustrated. The set 50 is like the set 20 except that the interior bonding pads 51 of set 50 have a horizontal width of $(3/2)t_h$ and a horizontal or along the row spacing of $(3/2)t_h$ and have a vertical height of $(3/2)t_v$ and a vertical or along the column spacing of $(3/2)t_v$. Thus, the interior bonding pads 51 are square and have four times the area of the interior bonding pads 21. The pads 51 provide the same ratio of bonding pad area to mounting surface area as the pads 21. However, the combined edge length of the pads 51 of set 50 is only half that of the pads 21 of set 20. This lessor combined edge length results in a lesser self-alignment force being supplied by the solder on the bonding pads 51 than is provided by the solder on the bonding pads 21. Reducing the interior pad spacing in FIG. 5 to $\frac{3}{4}t_h$ horizontally and $\frac{3}{4}t_v$ vertically would result in a combined edge length of 8/9 of the combined edge length of the pads 21 of set 20. Thus, it is preferred that both of the integers $I_h$ and $I_v$ have the value 2 since this provides interior pads of this type with a maximum combined edge length.

Figure 6:
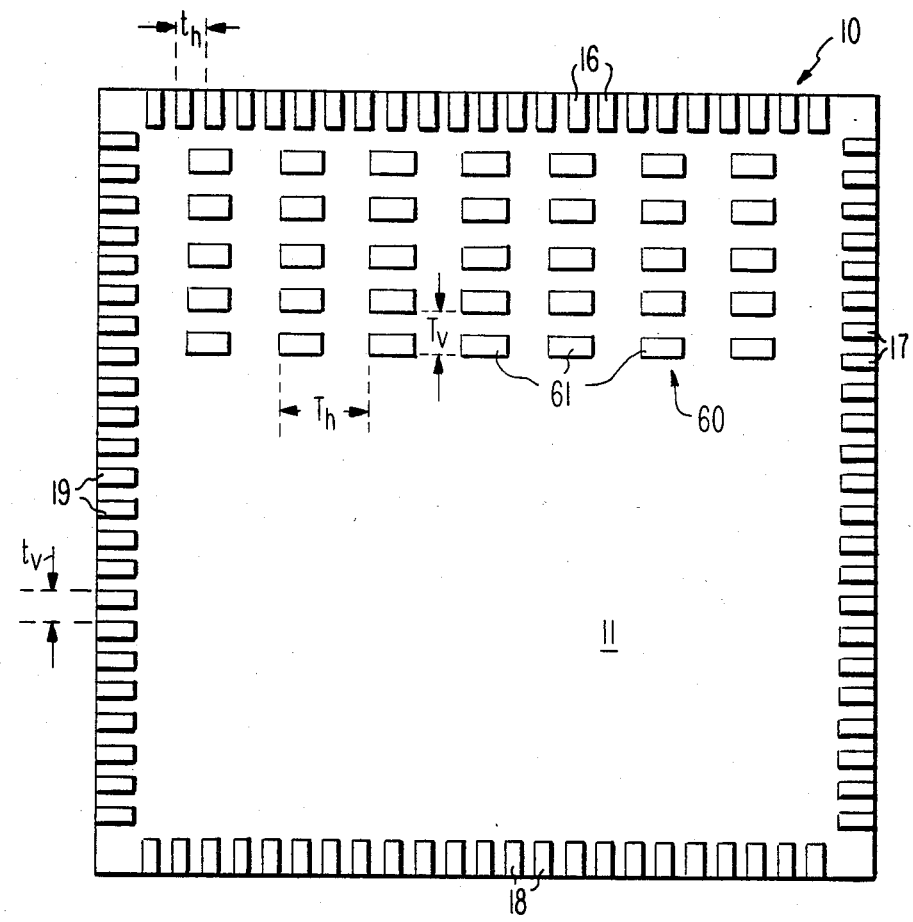

Another alternative set 60 of bonding pads 61 is illustrated in FIG. 6. This set again is like the set 20 except that the interior bonding pads 61 are rectangular. The interior bonding pads 61 are all oriented in the same direction and have a horizontal width of $(3/2) t_h$ and a horizontal spacing of $\frac{3}{4}t_h$ for a horizontal period of $(2\frac{1}{4})t_h$ and a vertical height of $(\frac{3}{4})t_v$ and a vertical spacing of $(\frac{3}{4})t_v$ for a vertical period of $(3/2)t_v$. Thus, the value (3) of the integer $I_h$ is different than the value (2) of the integer $I_v$. This interior pad configuration provides the interior pads of set 60 with the same combined edge length as pad set 20. However, the resulting self-alignment force is asymmetric since the combined horizontal edge length is twice the combined vertical edge length.

Figure 7:
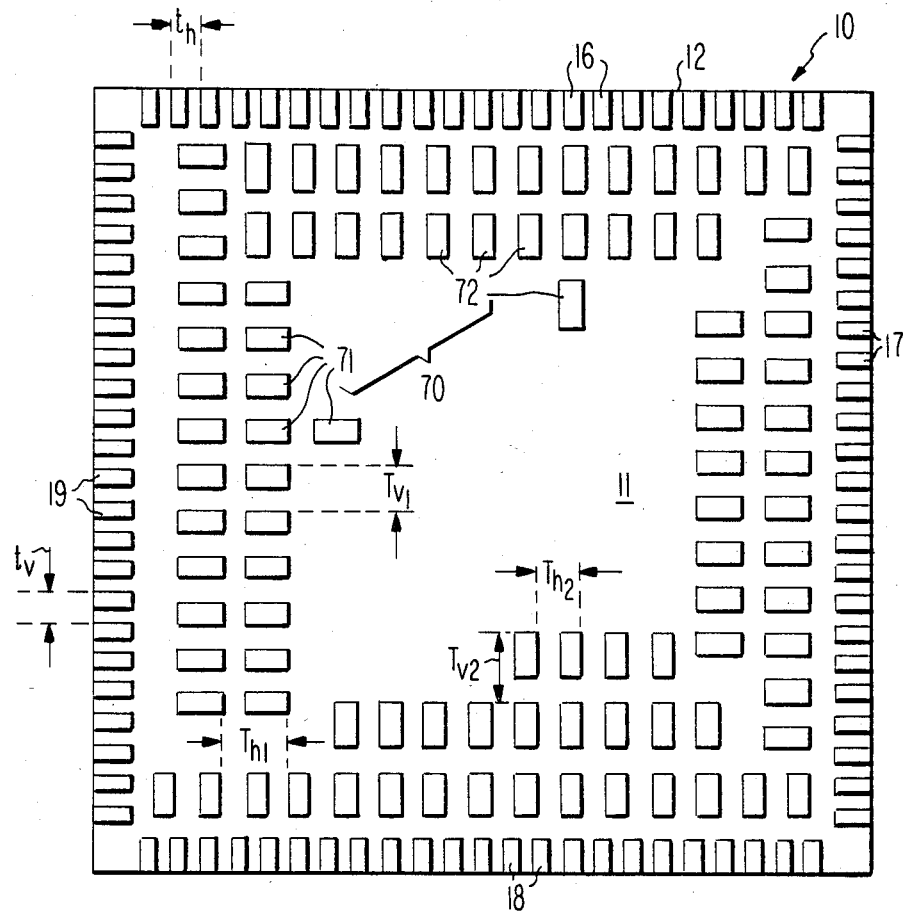

Another alternative set 70 of interior bonding pads 71 and 72 is illustrated in FIG. 7. The pads 71 and 72 are rectangular and the same size as the bonding pads 61 of set 60 in FIG. 6. However, unlike set 60 of FIG. 6 the pads in set 70 are not aligned all in the same orientation. Pads 71 are distributed along the vertical ends 13 and 15 of package 10 and are all oriented with their longer edge perpendicular to the nearby end 13 or 15 of surface 11. Pads 72 are distributed along the horizontal ends 12 and 14 of the carrier and are all oriented with their longer edges perpendicular to the nearby end 12 or 14 of surface 11. Since it is the edges of the pads which extend perpendicular to the adjacent or nearby end of the mounting surface 11 which create the alignment force parallel to that end of the mounting surface, the orientation of the pads 71 and 72 increases the self-alignment force along an end of the mounting surface over that provided by the pad set 20. This alignment force is in the direction to pull contact pads along that nearby edge into alignment. Thus, this distribution of bonding pads provides a pull-in force along each end of mounting surface 11 which is oriented in the manner to have a greater effect in pulling peripheral contact pads which are overlapped with incorrect pads into alignment with the correct pads.

The bonding pads 71 and 72 of set 70 have a grid whose period depends on the location of the bonding pad on the mounting surface 11. Thus, the bonding pads 71 have a horizontal period $T_{h1}$ which is $2\frac{1}{4}$ times the period $t_h$ and a vertical period $T_{v1}$ which is $1\frac{1}{2}$ times the period $t_v$. In a similar manner, the contact pads 72 have a horizontal period $T_{h2}$ which is $1\frac{1}{2}t_h$ and a vertical period $T_{v2}$ which is equal to $2\frac{1}{4}$ times the vertical period $t_v$ of the contact pads 17 and 19 along the vertical ends 13 and 15. Thus, in the FIG. 7 embodiment the integer multipliers $I_h$ and $I_v$ depend on the pad location on mounting surface 11.

Figure 8:
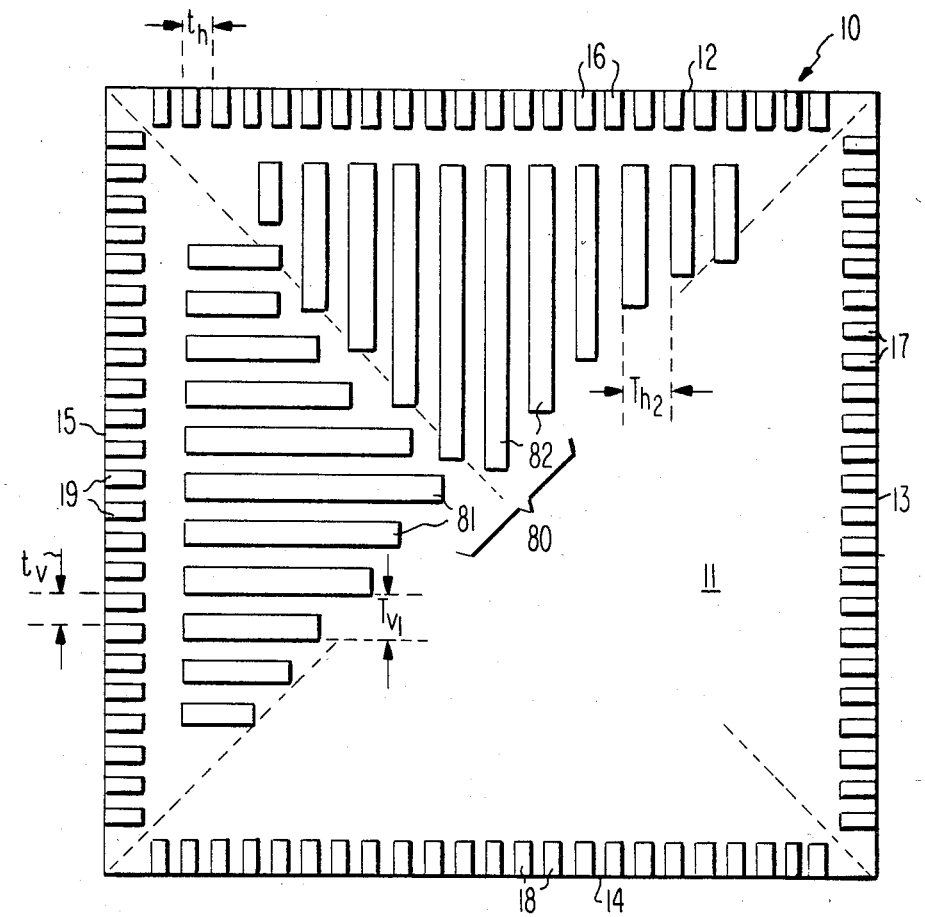

A further alternative set 80 of bonding pads 81 and 82 is illustrated in FIG. 8. The pads 81 and 82 are similar to the pads 71 and 72 in their placement and orientation. However, each pad 81 extends from a near vertical end (13 or 15) of the mounting surface 11 to near a diagonal of that surface. The pads 81 have a uniform vertical height of $(\frac{3}{4})t_v$ and a vertical period $T_{v1}$ of $(3/2)t_v$. The horizontal length of the pads 81 varies in accordance with their vertical position along the surface 11.

In a similar manner, each pad 82 extends from near a horizontal edge of surface 11 to near a diagonal of that surface. The pads 82 have a uniform horizontal width of $(\frac{3}{4})t_h$ and a horizontal period of $(3/2)t_h$. The vertical length of the pads 82 varies in accordance with their horizontal position across the surface 11.

In the vicinity of each end of mounting surface 11 the configuration of the pad set 80 provides a near maximum interior pad edge length perpendicular to that end. This provides a given self-alignment force with a maximum effect on chip carrier location.

The present invention provides a number of benefits in the bonding of leadless chip carriers to substrates. Foremost among these is the additional self-alignment force and additional chip retention force provided by the increased pad area and combined pad edge length. The interior pads also provide a means of increasing the thermal conduction between the leadless chip carrier and the substrate over that which is provided with just peripheral pads. The interior pads may, if desired, collectively provide a power ground connection or may individually provide individual signal or power connections.

What is claimed is:

1. In a surface mounted chip carrier having a mounting surface having an outer periphery and an inner portion spaced from said outer periphery, said package having a plurality of solderable peripheral pads disposed on said mounting surface along the periphery thereof, a plurality of solderable interior pads disposed in spaced relation on said inner portion thereof, and said peripheral pads having widths and spacings parallel to a first end of said mounting surface in accordance with a first predetermined period, the improvement comprising:

said interior pads adjacent said first end of said mounting surface being positioned along said first end in accordance with a second period which is equal to three quarters of said first period multiplied by an integer greater than one.

2. The carrier recited in claim 1 wherein said integer multiplier is two.

3. The carrier recited in claim 1 wherein:

said interior pads have first widths and first spacings parallel to said first end of said mounting surface which are equal.

4. The carrier recited in claim 3 wherein:
said interior pads have second widths and second spacings along a second end of said mounting surface which is perpendicular to said first end, said second widths and second spacings being equal.

5. The carrier recited in claim 4 wherein said first and second widths are equal.

6. The carrier recited in claim 1 wherein:
said interior pads have first widths and first spacings parallel to said first end of said mounting surface;
said interior pads have second widths and second spacings along a second end of said mounting surface which is perpendicular to said first end; and
said first width is different from said second width.

7. The carrier recited in claim 1 wherein:
said interior pads have first widths and first spacings parallel to said first end of said mounting surface; and
said first width is different for interior pads at a first location on said surface than it is for interior pads at a second location on said surface.

8. The carrier recited in claim 7 wherein:
said interior pads have second widths and second spacings parallel to a second end of said mounting surface which is perpendicular to said first end; and
said second width is different for interior pads at a third location on said surface than it is for interior pads at a fourth location on said surface.

* * * * *